US008169844B2

(12) United States Patent
Azimi et al.

(10) Patent No.: US 8,169,844 B2
(45) Date of Patent: May 1, 2012

(54) MEMORY BUILT-IN SELF-CHARACTERIZATION

(75) Inventors: Kouros Azimi, Center Valley, PA (US); Roger A. Fratti, Mohnton, PA (US); Danny Martin George, Walnutport, PA (US); Richard J. McPartland, Nazareth, PA (US)

(73) Assignee: Agere Systems Inc., Allentown, PA (US)

( * ) Notice: Subject to any disclaimer, the term of this patent is extended or adjusted under 35 U.S.C. 154(b) by 155 days.

(21) Appl. No.: 12/494,718

(22) Filed: Jun. 30, 2009

(65) Prior Publication Data
US 2010/0329054 A1 Dec. 30, 2010

(51) Int. Cl.
*G11C 7/00* (2006.01)
(52) U.S. Cl. .... 365/201; 365/226; 365/228; 324/762.02
(58) Field of Classification Search .................. 365/201, 365/226, 228; 324/762.02, 762.01
See application file for complete search history.

(56) References Cited

U.S. PATENT DOCUMENTS

| | | | |
|---|---|---|---|
| 5,334,929 A | 8/1994 | Schade, Jr. | |
| 5,519,313 A * | 5/1996 | Wong et al. | 323/315 |
| 6,211,727 B1 * | 4/2001 | Carobolante | 327/543 |
| 6,330,697 B1 * | 12/2001 | Clinton et al. | 714/721 |
| 6,844,750 B2 * | 1/2005 | Hsu et al. | 324/762.09 |
| 6,982,591 B2 * | 1/2006 | Abadeer et al. | 327/543 |
| 7,138,851 B2 * | 11/2006 | Sumita et al. | 327/534 |
| 7,162,652 B2 * | 1/2007 | Issa et al. | 713/300 |
| 7,215,590 B1 * | 5/2007 | Borden et al. | 365/226 |
| 7,230,602 B2 * | 6/2007 | Lin | 345/100 |
| 7,362,131 B2 * | 4/2008 | Balasubramanian et al. | 326/38 |
| 7,459,958 B2 * | 12/2008 | Barrows et al. | 327/534 |
| 7,592,876 B2 * | 9/2009 | Newman | 331/57 |
| 7,639,033 B2 * | 12/2009 | Rahim et al. | 324/754.03 |
| 7,779,281 B1 * | 8/2010 | Brumett et al. | 713/322 |
| 7,852,692 B2 * | 12/2010 | Zhang et al. | 365/201 |
| 7,863,925 B2 * | 1/2011 | Sugawa et al. | 324/762.09 |

* cited by examiner

*Primary Examiner* — Viet Q Nguyen
(74) *Attorney, Agent, or Firm* — Ryan, Mason & Lewis, LLP

(57) ABSTRACT

A memory circuit includes an operational memory and a monitor circuit comprising a circuit element in the operational memory and/or a circuit element substantially identical to a corresponding circuit element in the operational memory. The monitor circuit is operative to measure at least one functional characteristic of the operational memory. A control circuit coupled to the monitor circuit is operative to generate a control signal which varies as a function of the measured characteristic of the operational memory. The memory circuit further includes a programmable voltage source coupled to the operational memory which is operative to generate at least a voltage and/or a current supplied to at least a portion of the operational memory which varies as a function of the control signal.

26 Claims, 4 Drawing Sheets

100

100

400

500

MEMORY BUILT-IN SELF-CHARACTERIZATION

FIELD OF THE INVENTION

The present invention relates generally to the electrical, electronic, and computer arts, and more particularly relates to memory circuits.

BACKGROUND OF THE INVENTION

A trend in modern integrated circuits (ICs) is to include more and larger memory circuits on chip (e.g., embedded memory) for performing various functions of the IC. There is also a trend to shrink geometries (e.g., feature sizes) of circuit elements in the IC to thereby increase the number of functions incorporated into the IC and/or to reduce die size, and thereby reduce manufacturing cost. Unfortunately, these two objectives have significantly increased the total power consumption in the IC. Moreover, the percentage of total power consumption in the IC attributable to memory circuits has increased dramatically.

Memory circuits are operated at greater speeds with higher applied voltage, and therefore exhibit higher active and leakage power consumption in an IC. IC manufacturing process and variations within the manufacturing process (i.e., process variations) also influence power consumed by the memory circuits. For example, a fast IC process typically produces transistors and other circuit elements which tend to operate at relatively fast speeds but which consume relatively high power compared to a normal IC fabrication process. Alternatively, a slow IC process typically produces transistors and other circuit elements that tend to consume relatively low power but operate at relatively slow speeds compared to a normal IC fabrication process. Accordingly, a trade-off between power consumption and speed exists.

Temperature also affects memory speed and power consumption in the IC, primarily due to leakage current. In general, transistor leakage current may be defined as current conducted by a transistor when it is in the "off" (i.e., nonconductive) state. More particularly, source-to-drain leakage current may be defined as current conducted by a field-effect-transistor (FET) between the source and drain terminals when it is in the "off" (i.e., nonconductive) state. Gate leakage current may be defined as current conducted from the gate to the source, drain, and/or substrate of a FET. Leakage current in an IC is dependent on temperature and voltage as well as IC process and process variations (e.g., process, voltage and/or temperature (PVT) variations).

Various techniques have been proposed which attempt to maintain power consumption attributable to memory circuits in an IC at or below prescribed threshold levels, including, for example, reducing performance in the memory circuits (e.g., reducing speed), selective power-down of memory sub-arrays, and supplying memory circuits with one voltage while supplying memory peripheral circuits with a different voltage. It is also known to use process monitors in the IC. Standard process monitors are typically comprised of a small number of circuit structures located external to the memory circuits which are operative to approximate certain process-related parameters of the IC. However, such conventional process monitors directed to the general IC are not capable of adequately measuring operational performance within the memory circuits. Consequently, techniques for optimizing power consumption in the memory circuits, which contribute to an ever-increasing percentage of the overall IC power consumption, are ineffective.

SUMMARY OF THE INVENTION

Illustrative embodiments of the present invention provide techniques for reducing power consumption in an IC without significantly impacting performance of the IC. To accomplish this, embodiments of the invention advantageously control a level of voltage supplied to one or more memory circuits in the IC to achieve a prescribed operation of the memory circuits while minimizing power consumption and limiting leakage current in the memory circuit to a prescribed level.

In accordance with one aspect of the invention, a memory circuit includes an operational memory and a monitor circuit comprising a circuit element in the operational memory and/or a circuit element substantially identical to a corresponding circuit element in the operational memory. The monitor circuit is operative to measure at least one functional characteristic of the operational memory. A control circuit coupled to the monitor circuit is operative to generate a control signal which varies as a function of the measured characteristic of the operational memory. The memory circuit further includes a programmable voltage source coupled to the operational memory which is operative to generate at least a voltage and/or a current supplied to at least a portion of the operational memory which varies as a function of the control signal. The memory circuit may be embodied in an IC including one or more of such memory circuits.

In accordance with another aspect of the invention, a method of operating a circuit including an operational memory so as to reduce overall power consumption in the circuit includes the steps of: measuring at least one functional characteristic of the operational memory using a monitor circuit, the monitor circuit comprising a circuit element in the operational memory and/or a circuit element substantially identical to a corresponding circuit element in the operational memory; generating a control signal which varies as a function of the at least one functional characteristic of the operational memory; and controlling a level of at least one of a voltage and a current supplied to at least a portion of the operational memory as a function of the control signal.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate similar elements throughout the several views of the drawings, and wherein.

It is to be appreciated that elements in the figures are illustrated for simplicity and clarity and have not necessarily been drawn to scale. Moreover, common but well-understood elements that may be useful or necessary in a commercially feasible embodiment may not be shown in order to facilitate a less obstructed view of the illustrated embodiments.

DETAILED DESCRIPTION OF THE INVENTION

The present invention will be described herein in the context of illustrative memory circuits and a method for reducing power consumption in a memory circuit. It is to be appreciated, however, that the techniques of the present invention are not limited to the specific method and circuits shown and described herein. Rather, embodiments of the invention are directed broadly to techniques for beneficially reducing power consumption in a memory circuit without significantly impacting performance of the memory circuit. For this reason, numerous modifications can be made to these embodiments and the results will still be within the scope of the invention. No limitations with respect to the specific embodiments described herein are intended or should be inferred.

Although implementations of the present invention may be described herein with specific reference to n-channel metal-oxide-semiconductor (NMOS) transistors devices and p-channel metal-oxide-semiconductor (PMOS) transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Aspects of the present invention advantageously provide a memory circuit having reduced power consumption. The memory circuit may comprise, for example, an embedded memory (e.g., a memory embedded within an IC) or a stand-alone memory (e.g., a memory that is the primary component within an IC). The memory is, for example, a volatile memory, a non-volatile memory or a memory comprising both volatile and non-volatile memory elements. Examples of volatile memory, that the memory may comprise, are static random access memory (SRAM) and dynamic random access memory (DRAM). Examples of non-volatile memory, that the memory may comprise, are read only memory (ROM), flash memory, one-time programmable (OTP) memory, few-times programmable (FTP) memory, and phase change memory (PCM).

Figure 1A:
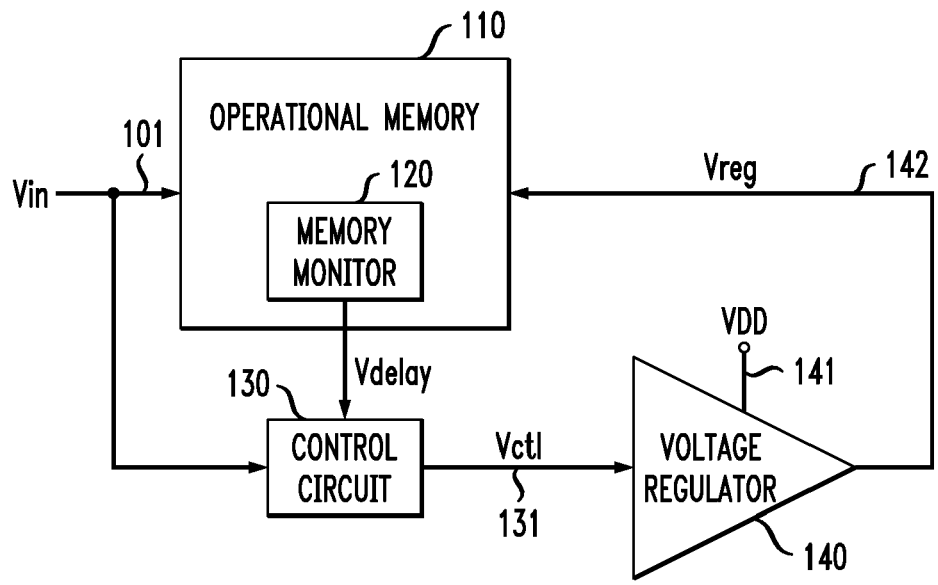
FIG. 1A is a block diagram illustrating at least a portion of an exemplary memory circuit including a monitor circuit, at least a portion of which resides within an operational memory in the memory circuit, according to an embodiment of the present invention.

FIG. 1A is a block diagram illustrating at least a portion of an exemplary memory circuit 100, according to an embodiment of the present invention. Memory circuit 100 comprises an operational memory 110, a memory monitor circuit 120 coupled to the operational memory, a control circuit 130 coupled to the memory monitor circuit, and a voltage regulator 140, or an alternative programmable voltage source, coupled to an output of the control circuit. An output of the voltage regulator 140 is coupled to the operational memory 110 by way of a feedback path 142, or an alternative connection arrangement. The operational memory 110, memory monitor circuit 120, control circuit 130 and voltage regulator 140 are preferably connected together in a manner which forms a closed-loop feedback control system.

The term "operational memory" as used herein is intended to broadly refer to circuitry comprising a plurality of memory cells, preferably organized into a memory array, and other circuitry necessary for operating the memory array (e.g., column and row circuitry, sense amplifiers, address decoders, pre-charge circuitry, memory controllers, etc.), so that addressed memory locations within the memory array can be selectively accessed (e.g., read from and, for writable memory, written to). Operational memory 110 preferably includes, for example, memory (e.g., embedded memory) that is operative to perform and/or support at least a portion of the functions of an IC which comprises the memory circuit 100. Access to the operational memory 110, such as, for example, reading data from and/or writing data to one or more memory cells in the memory, may be provided via at least one connection 101 to the operational memory, although alternative means for accessing the operational memory are contemplated.

Figure 1B:
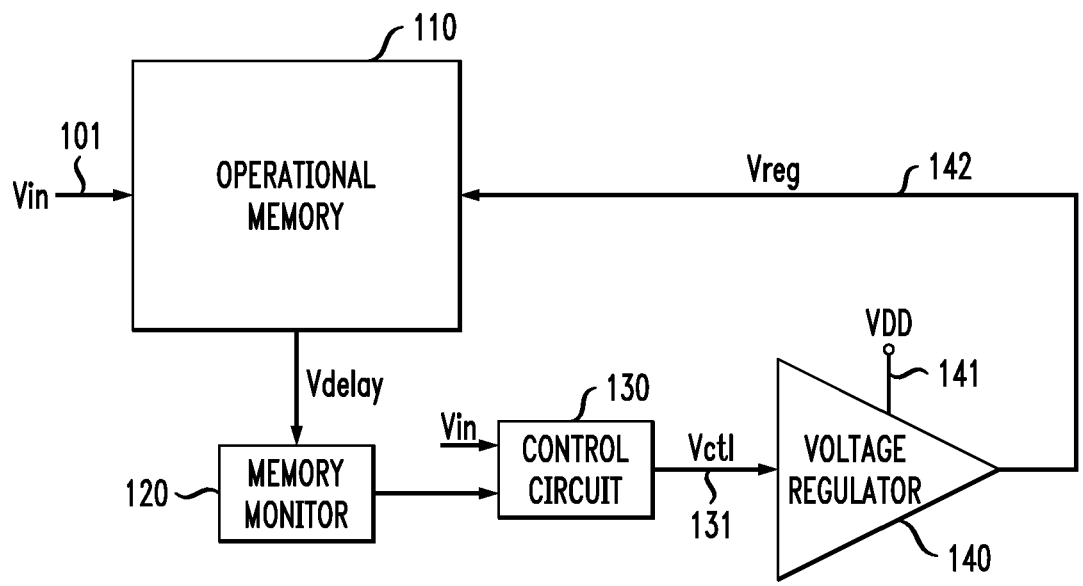
FIG. 1B is a block diagram illustrating at least a portion of an exemplary memory circuit including a monitor circuit residing externally to an operational memory in the memory circuit, according to an embodiment of the present invention.

In the illustrative embodiment of FIG. 1A, operational memory 110 comprises memory monitor circuit 120. However, it is to be appreciated that in alternative embodiments of the invention, an example of which is depicted in FIG. 1B, operational memory 110 does not include but may be coupled to memory monitor circuit 120. With reference to FIG. 1B, memory monitor circuit 120 resides externally to operational memory 110 and is not inherently necessary for the functioning of the operational memory. Moreover, in other embodiments, a portion of the memory monitor circuit 120 resides within the operational memory 110 and a portion of the memory monitor circuit resides externally to the operational memory. In any case, it may be preferable to physically place at least a portion of memory monitor circuit 120 in close relative proximity to operational memory 110, such as, for example, adjacent to or surrounded by the operational memory. In this manner, the memory monitor circuit 120 can more closely track variations in one or more characteristics of the operational memory 110.

Figure 2:
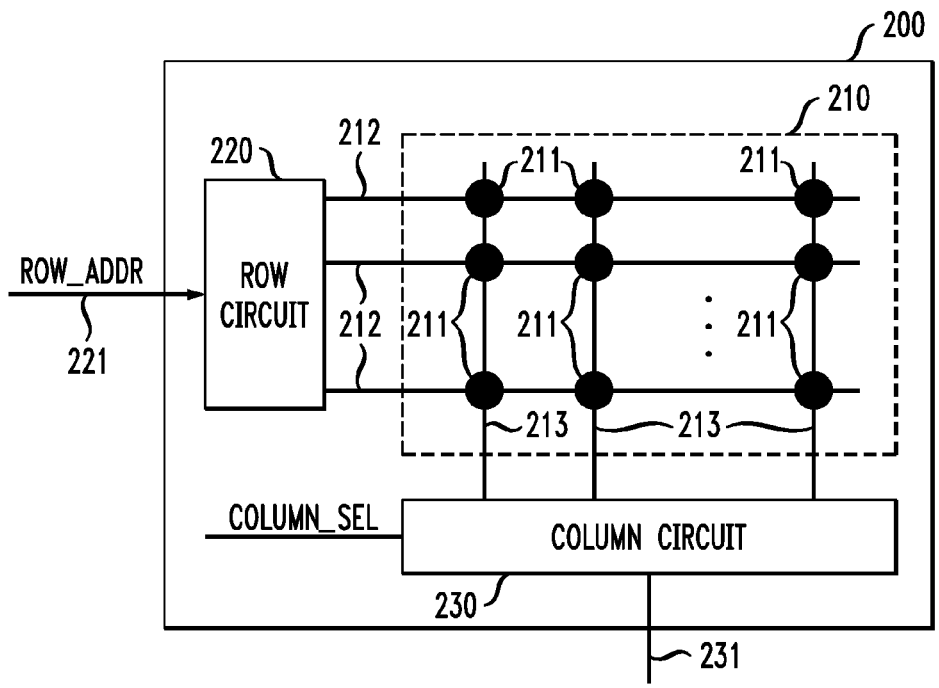
FIG. 2 is a schematic diagram depicting at least a portion of an exemplary operational memory suitable for use in the memory circuit of FIGS. 1A and 1B, according to an embodiment of the invention.

FIG. 2 is a schematic diagram depicting at least a portion of an exemplary operational memory 200 suitable for use in the memory circuit 100 shown in FIGS. 1A and 1B, according to an embodiment of the invention. Operational memory 200 comprises an array 210 including a plurality of memory cells 211, at least one row line 212, and at least one column line 213. The memory cells 211 are preferably arranged in a plurality of rows and columns, with each memory cell being located at an intersection of a corresponding unique pair of a row line 212 and a column line 213. Alternative arrangements of the memory cells 211 are similarly contemplated. Memory cells 211 may comprise, for example, volatile memory cells and/or non-volatile memory cells. Volatile memory cells loose data content when power is removed from the cell. Types of volatile memory cells include, for example, static random access memory (SRAM) and dynamic random access memory (DRAM). Non-volatile memory cells, on the other hand, retain data content even when not powered. Types of non-volatile memory cells suitable for use in the present invention include, for example, flash memory cells, phase change memory (PCM) cells, one-time programmable (OTP) memory cells, few-times programmable (FTP) memory cells, read-only memory (ROM) cells, etc.

The operational memory 200 further comprises a row circuit 220 and column circuit 230. Row circuit 220 preferably comprises a row address decoder and at least one row driver coupled to each row line 212 (not explicitly shown). The row address decoder is coupled to the row drivers and selects a given one of the rows as a function of a row address signal (Row_Addr), or an alternative control signal, supplied to the row circuit 220 via a row circuit input 221. In an alternative embodiment, row circuit 220 may comprise a single row driver and a row multiplexer operative to connect the row driver to a selected one of the row lines 212.

Although not explicitly shown, column circuit 230 preferably comprises a column address decoder, sense amplifiers and, optionally, column multiplexers, the sense amplifiers being coupled to the column lines 213 either directly or through the column multiplexers. Column circuit 230 selects a given one of the column lines 213 coupled thereto as a function of a column select signal (Column_Sel), or an alternative control signal, supplied to the column circuit. Data read from one or more selected memory cells and/or data written to the memory cells may be conveyed via a column circuit input/output (I/O) connection 231. Alternative circuitry for selectively accessing the memory cells 211 coupled to the row and column lines 212, 213 is similarly contemplated by the invention.

The operational memory may comprise multiple circuit elements, including those circuit elements shown in FIG. 2 and described above, as well as other circuit elements that may not be explicitly shown, including circuit elements forming at least a portion of one or more signal delay paths and/or current leakage paths in the operational memory. By way of example only, one source of signal delay in the operational memory 200 may comprise a first delay path through the row decoder and row driver in row circuit 220 which delays a signal supplied to the row circuit input 221 propagating to a corresponding row line 212. A second delay path in the operational memory 200 may be through a given memory cell 211 to a corresponding column line 213, which delays a data signal (which is indicative of a data state of the memory cell) associated with the memory cell from developing on the column line. Development of the data signal generated in a given memory cell 211 on a corresponding column line 213 is preferably initiated by activation of a row line 212 coupled to the given memory cell. A third delay path in the operational memory 200 may be through the column circuit 230; that is, through a column multiplexer and a sense amplifier, to the corresponding column circuit I/O connection 231.

Signal delay and/or current leakage paths in the operational memory 200 may comprise a combination of one or more identified signal delay paths and/or current leakage paths. For example, an input to the second delay path may be coupled to an output of the first delay path to form a new signal delay path. Likewise, an input to the third delay path may be coupled to an output of the second delay path to form a new signal delay path. Thus, a composite signal delay path may comprise a combination of the first, second and third delay paths. The composite delay path may include all circuit elements from the row circuit input 221 to the column circuit I/O connection 231. Memory access time and memory cycle time are two characteristics of the operational memory 200 that are a function of composite delay in the operational memory.

With continued reference to FIGS. 1A and 1B, the memory monitor circuit 120 in memory circuit 100 is operative to monitor one or more operating characteristics of the operational memory 110. Rather than externally monitoring the performance of operational memory 110 using generic delay paths (e.g., a ring oscillator) or other conventional means, which often does not provide sufficient accuracy for evaluating operating conditions in the operational memory, memory monitor circuit 120 comprises at least one of the circuit elements found within the operational memory 110, or a circuit element identical to a corresponding circuit element within the operational memory, such as, for example, the first delay path, the second delay path, the third delay path, a memory cell, a column of memory cells, a row of memory cells, a sense amplifier, a column multiplexer, a row decoder, a row driver, and/or a facsimile of any of the aforementioned elements, etc. Thus, according to an aspect of the invention, although shown as separate functional blocks for economy of description, at least a portion of memory monitor circuit 120 may be integrated within operational memory 110 and may share at least one circuit element therewith.

Figure 3:
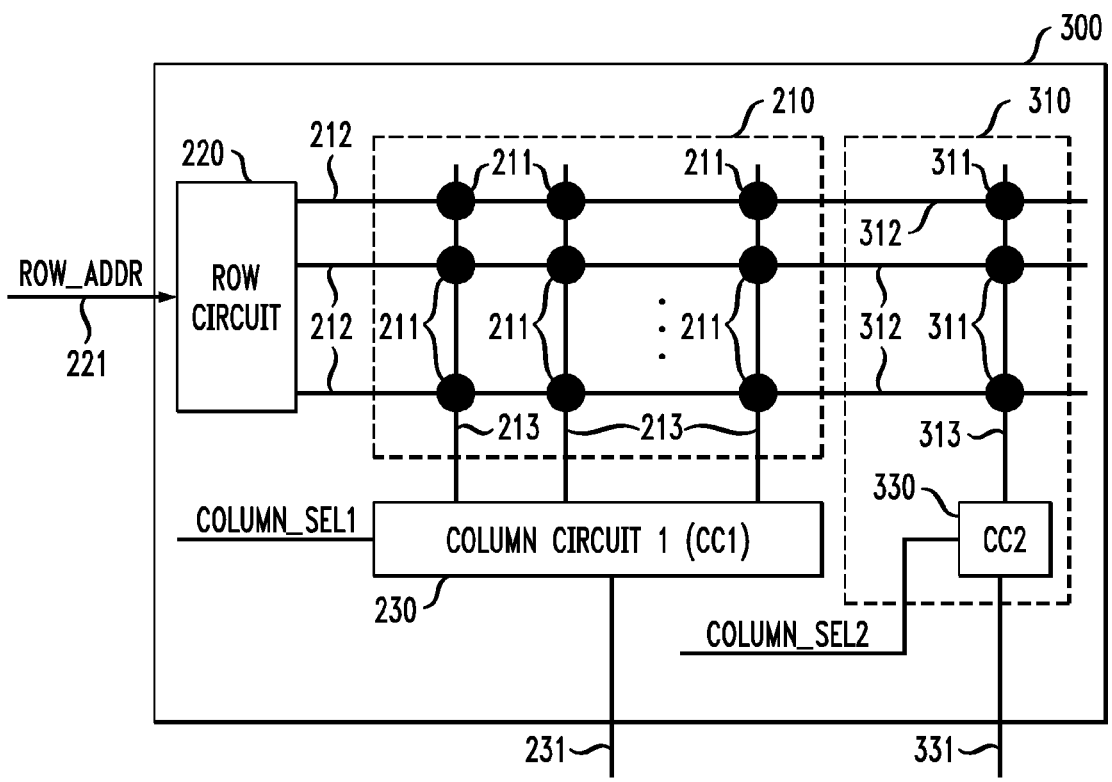
FIG. 3 is a schematic diagram depicting an exemplary operational memory suitable for use in the illustrative memory circuit shown in FIGS. 1A and 1B, according to an embodiment of the invention.

FIG. 3 is a schematic diagram depicting an exemplary operational memory 300 suitable for use in the memory circuit 100 shown in FIG. 1A or 1B, according to an embodiment of the invention. It is to be understood that alternative operational memory arrangements are similarly contemplated for suitable use with the present invention. Operational memory 300, like operational memory 200 shown in FIG. 2, preferably comprises an array 210 including a first plurality of memory cells 211, at least one row line 212, and at least one column line 213. Memory cells 211 are preferably arranged in a plurality of rows and columns, with each memory cell being located at an intersection of a corresponding unique pair of a row line 212 and a column line 213, although alternative arrangements of the memory cells 211 are similarly contemplated.

Operational memory 300 also comprises a row circuit 220 coupled to the row lines 212 and a first column circuit (CC1) 230 coupled to the column lines 213. As stated above, row circuit 220 may include a row address decoder and at least one row driver (not explicitly shown) coupled to each row line 212. The row address decoder is operative to select a given one of the rows as a function of a row address signal (Row_Addr), or an alternative control signal, supplied to the row circuit 220 via a row circuit input 221. First column circuit 230 may include a column address decoder, sense amplifiers and column multiplexers coupled to the column lines 213 either directly or through the column multiplexers. First column circuit 230 is operative to select a given one of the column lines 213 coupled thereto as a function of a first column select signal (Column_Sel1), or an alternative control signal, supplied to the first column circuit. Data read from one or more selected memory cells and/or data written to the memory cells may be conveyed via a first column circuit input/output (I/O) connection 231. Alternative circuitry for selectively accessing the memory cells 211 coupled to the row and column lines 212, 213 is similarly contemplated by the invention.

Operational memory 300 further comprises a memory monitor circuit 310. Memory monitor circuit 310 is preferably an embodiment of the memory monitor circuit 120 shown in FIGS. 1A and 1B. As previously explained, at least a portion of the memory monitor circuit 310 is integrated within operational memory 300 and shares at least one circuit element therewith (e.g., row circuit 220 and row lines 212). In an alternative embodiment (e.g., shown in FIG. 1B), memory monitor circuit 310 may not be included within, but is external to the operational memory, wherein the operational memory comprises all the elements of circuit 300 excluding the memory monitor circuit 310. Memory monitor circuit 310 preferably comprises a second plurality of memory cells 311 and at least one additional column line 313, each of the memory cells 311 being connected at an intersection of a corresponding unique pair of a row line 312 and a column line 313, although alternative arrangements of the memory cells 311 are similarly contemplated. As apparent from the figure, the row lines 312 to which the second plurality of memory cells 311 are connected are preferably an extension of the row lines 212 to which the first plurality of memory cells 211 in memory array 210 are connected.

Memory monitor circuit 310 further comprises a second column circuit (CC2) 330 coupled to the column line 313. Although not explicitly shown, second column circuit 330 may include, for example, an additional multiplexer and an additional sense amplifier, among other circuitry. The multiplexer in second column circuit 330 is preferably operative to selectively connect column line 313 to the corresponding sense amplifier as a function of a second column select signal (Column_Sel2), or an alternative control signal, supplied to the second column circuit.

Preferably, the additional column line 313 in memory monitor circuit 310 is substantially identical to any one of the column lines 213, and memory cells 311 are substantially identical to memory cells 211. Likewise, the sense amplifier and/or other circuitry (e.g., multiplexer, etc.) in second column circuit 330 are preferably substantially identical to the sense amplifier and/or other circuitry in first column circuit 230. Although the invention is not limited to any particular number of memory cells connected to a given column line, the number of memory cells connected to column lines 213 and 313 are preferably the same relative to one another. Together, a column in memory monitor circuit 310, which may include column line 313 and corresponding memory cells 311, sense amplifier and other circuitry coupled thereto, is preferably substantially identical to a given column in memory array 210, which may similarly include a column line 213 and corresponding memory cells 211, sense amplifier and other circuitry coupled thereto. In this manner, the loading on column line 313 will be substantially identical to the loading on a given one of column lines 213.

When a selected row line 212 is activated, a monitor data signal is generated, originating within a memory cell 311 connected to a corresponding selected row line 312 in memory monitor circuit 310. The monitor data signal, which is indicative of a data state of the memory cell 311 coupled to the selected row line 312, is developed on column line 313 and propagates through the second column circuit 330 to the second column circuit output 331. Because the first delay path, which, as previously stated, preferably includes the delay through the row circuit 220, is common to both the memory array 210 and the memory monitor circuit 310, the memory monitor circuit, in conjunction with the control circuit 130 (FIGS. 1A and 1B), measures the delay through the entire composite delay path. Since the memory cells 311 and second column circuit 330 in memory monitor circuit 310 are ideally the same as the memory cells 211 and first column circuit 230, the delay measured by the monitor circuit should closely track, and thereby accurately predict, the actual delay through the remaining portion of operational memory 300 (e.g., including memory array 210 and the first column circuit).

In the context of the illustrative memory circuit 100 shown in FIGS. 1A and 1B, a signal, Vdelay, received by control circuit 130 is preferably a delayed version of an input signal Vin supplied to connection 101 of the operational memory 110. This delayed version of the input signal is generated by memory monitor circuit 120, for example, as an output signal from the second column circuit 330 (FIG. 3). In accordance with one embodiment of the invention, the control circuit 130 directly receives the input signal Vin supplied to the row circuit in operational memory 110. The control circuit 130 is operative to measure the time delay between the input signal Vin and the delayed input signal Vdelay. The control circuit 130 generates a control signal, Vctl, which is a function of the measured time delay and supplies this control signal Vctl to voltage regulator 140. Voltage regulator 140 is operative to generate a controlled output voltage, Vreg, (or current) which is supplied to at least a portion of operational memory 110, Vreg having a voltage level which varies as a function of control signal Vctl. It is to be understood that, alternatively or in addition, the control circuit 130 may control a value of Vctl as a function of one or more other parameters measured by memory monitor circuit 120 (e.g., temperature, voltage, leakage current, etc.), according to other aspects of the invention.

According to an embodiment of the invention, the control circuit 130 may be programmed with a prescribed (e.g., reference) delay. The prescribed delay, for example, may be indicative of a maximum acceptable delay in the operational memory 110 for a given set of operating conditions (e.g., process, supply voltage, and/or temperature (PVT)). The control circuit 130 preferably compares the prescribed delay to the measured time delay and generates the control signal Vctl as function of the comparison between the two. To accomplish this, control circuit 130 may include a comparator. The control circuit 130, in conjunction with voltage regulator 140, is operative to adjust, or otherwise control, a level of voltage and/or current supplied to at least a portion of the operational memory 110. By way of example only, the control circuit 130, in conjunction with voltage regulator 140, may increase the voltage level of Vreg when the measured time delay is greater than the prescribed delay, and may decrease the voltage level of Vreg when the measured time delay is less than the prescribed delay. In this manner, the supply voltage to the operational memory 110 may be controlled so that the operational memory functions within prescribed specifications using a minimum voltage level, thereby beneficially reducing power consumption in the memory circuit 100.

Figure 4:
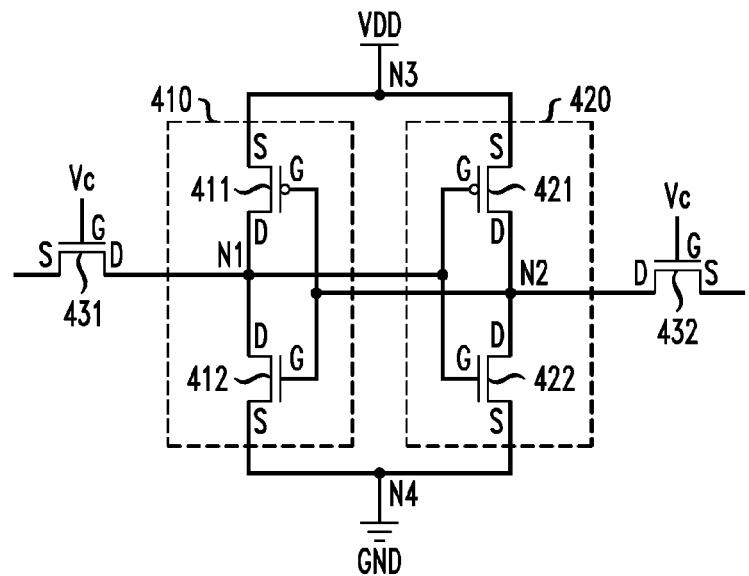
FIG. 4 is a schematic diagram depicting at least a portion of an exemplary six-transistor SRAM memory cell suitable for use in the illustrative memory circuit shown in FIGS. 1A and 1B.

FIG. 4 is a schematic diagram depicting at least a portion of an exemplary six-transistor (6T) SRAM memory cell 400 suitable for use in the memory circuit 100 shown in FIGS. 1A and 1B. Specifically, memory cell 400 may be used to implement one or more memory cells (e.g., 211 and/or 311) in the operational memory 300 shown in FIG. 3, according to an embodiment of the invention. Memory cell 400 preferably includes a pair of cross-coupled inverters connected to a pair of serial pass transistors, or alternative switches. The cross-coupled inverters form a simple latch which is operative to store a logical state of the memory cell 400. The pass transistors are preferably operative to selectively couple the latch to a pair of corresponding complementary bit lines, thereby providing selective access to the memory cell 400 as a function of a word line signal, or alternative control signal, supplied to the pass transistors.

More particularly, memory cell 400 comprises first and second inverters, 410 and 420, respectively, an input of the second inverter being connected to an output of the first inverter at node N1, and an output of the second inverter being connected to an input of the first inverter at node N2. Alternative latch configurations are similarly contemplated. The first inverter 410 may include a first PMOS transistor 411 and a first NMOS transistor 412. A source (S) of transistor 411 is adapted for connection to a first voltage source, which may be VDD, at node N3, a source of transistor 412 is adapted for connection to a second voltage source, which may be ground (GND), at node N4, drains (D) of the transistors 411 and 412 are connected together and form the output of the first inverter at node N1, and gates (G) of transistors 411 and 412 are connected together and form the input of the first inverter at node N2. Likewise, the second inverter 420 may include a second PMOS transistor 421 and a second NMOS transistor 422. A source of the transistor 421 is adapted for connection to the first voltage source at node N3, a source of transistor 422 is adapted for connection to the second voltage source at node N4, drains of transistors 421 and 422 are connected together and form the output of the second inverter at node N2, and gates of transistors 421 and 422 are connected together and form the input of the second inverter at node N1.

As previously stated, memory cell 400 further includes a pair of pass transistors coupled to the pair of cross-coupled inverters 410, 420. More particularly, memory cell 400 includes a first NMOS pass transistor 431 having a source forming a first data port of the memory cell, a drain connected to the output of the first inverter 410 at node N1, and a gate adapted to receive a word line signal, Vc, for selectively activating the first pass transistor as a function thereof. Memory cell 400 further includes a second NMOS pass transistor 432 having a source forming a second port of the memory cell, a drain connected to the output of the second inverter 420 at node N2, and a gate adapted to receive the word line signal Vc, or an alternative control signal. Although shown as NMOS transistors, it is to be understood that one or both pass transistors 431 and 432 may be implemented using NMOS transistors, PMOS transistors, or a combination of PMOS and NMOS transistors (e.g., a complementary pass gate).

Figure 5:
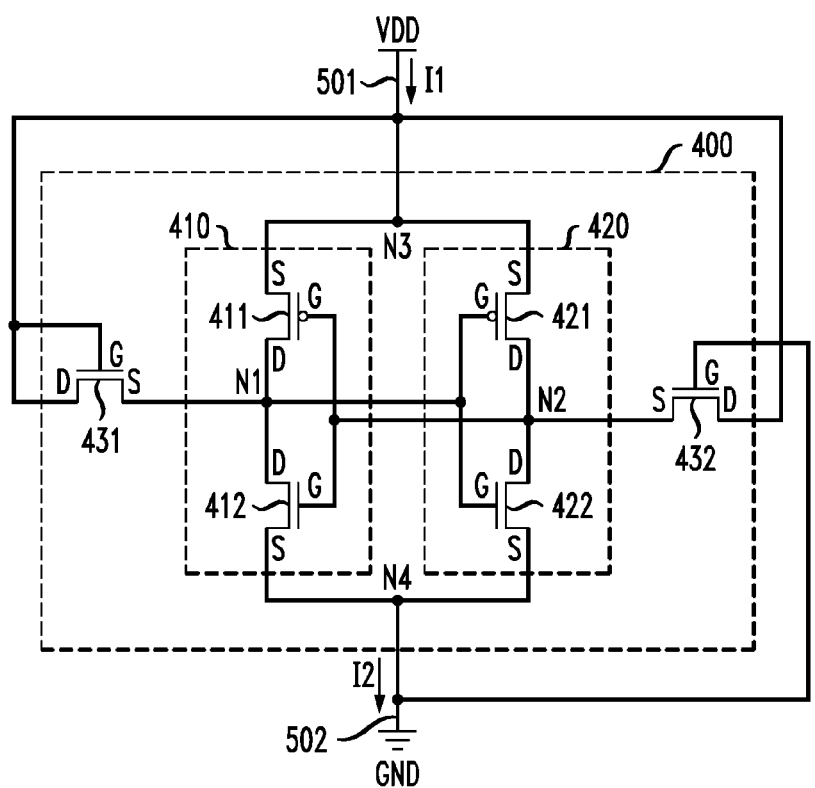
FIG. 5 is a schematic diagram depicting at least a portion of an exemplary memory monitor circuit, according to an embodiment of the present invention.

FIG. 5 is a schematic diagram depicting at least a portion of an exemplary memory monitor circuit 500, according to an embodiment of the invention. Memory monitor circuit 500, or multiple instances thereof, may be an implementation of all or a portion of memory monitor circuit 120 shown in FIGS. 1A and 1B, although the invention is not limited to this specific circuit configuration. For example, memory monitor circuit 500 may represent an implementation of a memory cell 311 in memory monitor circuit 310 (see FIG. 3). As apparent from the figure, memory monitor circuit 500 is preferably an identical or a modified version of the illustrative SRAM memory cell 400 depicted in FIG. 4.

More particularly, memory monitor circuit 500 comprises first and second inverters, 410 and 420, respectively, an input of the second inverter being connected to an output of the first inverter at node N1, and an output of the second inverter being connected to an input of the first inverter at node N2. Alternative latch configurations are similarly contemplated. The first inverter 410 includes a first PMOS transistor 411 and a first NMOS transistor 412. A source of transistor 411 is adapted for connection to a first voltage source, which may be VDD, at node N3, a source of transistor 412 is adapted for connection to a second voltage source, which may be ground (GND), at node N4, drains of transistors 411 and 412 are connected together and form the output of the first inverter at node N1, and gates of transistors 411 and 412 are connected together and form the input of the first inverter at node N2. The second inverter 420 includes a second PMOS transistor 421 and a second NMOS transistor 422. A source of the transistor 421 is adapted for connection to the first voltage source at node N3, a source of transistor 422 is adapted for connection to the second voltage source at node N4, drains of transistors 421 and 422 are connected together and form the output of the second inverter at node N2, and gates of transistors 421 and 422 are connected together and form the input of the second inverter at node N1.

Memory cell 500 further includes a pair of pass transistors coupled to the pair of cross-coupled inverters 410, 420. A first NMOS pass transistor 431 is included having a source connected to the output of the first inverter 410 at node N1. Memory cell 500 further includes a second NMOS pass transistor 432 having a source connected to the output of the second inverter 420 at node N2. Although shown as NMOS transistors, it is to be understood that one or both pass transistors 431 and 432 may be implemented using NMOS transistors, PMOS transistors, or a combination of PMOS and NMOS transistors (e.g., a complementary pass gate).

Memory monitor circuit 500 is preferably biased so that memory cell 400 is in a stable state with node N1 at a logic high ("1") level (e.g., VDD) and node N2 at a logic low ("0") level (e.g., ground or zero volt). To accomplish this, a drain and a gate of the first NMOS pass transistor 431 are coupled to VDD (e.g., in a diode configuration) at node N3, a drain of the second NMOS pass transistor 432 is also coupled to VDD at node N3, and a gate of pass transistor 432 is coupled to ground at node N4. Thus, pass transistor 432 is turned off. Since pass transistor 431 is connected in a diode configuration, the voltage at node N1 will be about a transistor threshold voltage, Vt, (e.g., about 0.7 volt) below the voltage at node N3 (e.g., VDD-Vt). Assuming VDD is about two transistor thresholds or greater (VDD μ2Vt), the voltage at node N1 will turn on transistor 422, thereby causing node N2 to be pulled substantially to ground (e.g., zero volt). With node N2 pulled low, transistor 412 will be turned off and transistor 411 will be turned on, thereby holding node N1 at a high level (e.g., VDD).

As stated above, when node N1 is high, PMOS transistor 421 is turned off and NMOS transistor 422 is turned on. Therefore, the only current flowing between a first terminal 501, adapted for connection to the first voltage source VDD, and a second terminal 502, adapted for connection to ground GND, through transistors 421 and 422 will be a first leakage current, $I_{leak1}$. Likewise, when node N2 is low, transistor 411 is turned on and transistor 412 is turned off. Therefore, the only current flowing between the first terminal 501 and the second terminal 502 through transistors 411 and 412 will be a second leakage current, $I_{leak2}$.

Since pass transistor 432 is turned off, the only current flowing between the first terminal 501 and the second terminal 502 through transistors 432 and 422 will be a third leakage current, $I_{leak3}$. Because the source and drain of pass transistor 431 are at substantially the same voltage (i.e., the first voltage source VDD), and because transistor 411 is turned on supplying the first voltage source VDD to node N1, there is no source to drain leakage through pass transistor 431.

Memory monitor circuit 500 accurately reflects and closely tracks leakage current that is substantially the same as the leakage current flowing through corresponding current paths in a given memory cell (e.g., 211) in the operational memory 110 shown in FIGS. 1A and 1B. Memory cell 211, during a precharge phase or standby phase, will be biased equivalently to the bias on memory cell 400, except that the pass transistor in memory cell 211, corresponding to pass transistor 431 in memory monitor circuit 500, is typically biased during the precharge or standby phase in the off-state with the gate terminal of the transistor at ground. The difference in gate terminal bias between the pass transistor in memory cell 211 and the pass transistor 431 in the memory monitor circuit 500 does not substantially affect leakage current through the pass transistors. Thus, memory monitor circuit 500 accurately measures leakage current flowing through all six transistors within a memory cell 211 in the array 210 of operational memory 200 (see FIG. 3).

In accordance with an embodiment of the invention associated with measuring memory cell leakage current, memory monitor circuit 500 may be an implementation of memory monitor circuit 120 shown in FIGS. 1A and 1B. In this embodiment, memory monitor circuit 120 comprises a column of memory cells (herein termed "a current monitor column") similar to the column of memory cells within memory monitor circuit 310 except that they are not coupled to rows 312 and may or may not be coupled to a second column circuit 330. Each of the memory cells within the current monitor column comprises the memory monitor circuit 500 and is referred to herein as a "current monitor memory cell." The first terminal 501 of all current monitor memory cells are coupled together to form a VDD supply terminal to the current monitor column. The second terminal 502 of all current monitor memory cells are coupled together to form a ground supply terminal to the current monitor column. One or both of the VDD and ground supplies to the current monitor column is keep separate from other VDD and/or ground supplies coupled to other portions of the memory circuit 100, e.g., VDD or ground supplies to memory cells 210. One or both of the VDD and ground supplies to the current monitor column replaces the coupling from the memory monitor circuit 120 to the control circuit 130 shown as "Vdelay" in FIGS. 1A and 1B. A current output signal from the memory monitor circuit 500 comprises current flowing through one or both of the VDD and ground supplies to the current monitor column (e.g., I1 or I2, respectively). The current output signal(s) (e.g., I1 and/or I2) is preferably provided to the control circuit 130, replacing the Vdelay signal in memory circuit 100 of FIGS. 1A and 1B.

The current output signal is indicative of source-to-drain leakage currents flowing within memory cells 211 in array 210 in the operational memory during memory precharge and standby phases. The control circuit 130 preferably measures the current output signal and converts the measured cell leakage current to a control signal indicative of the leakage current, and this control signal is supplied to the voltage regulator 140, as previously described. The voltage regulator 140 generates a controlled output voltage Vreg which varies as a function of the control signal supplied by the control circuit 130, as previously described.

Control circuit 130 may be programmed with a prescribed maximum cell leakage current. The control circuit 130 compares the prescribed maximum cell leakage current to the measured cell leakage current and, in conjunction with voltage regulator 140, adjusts the voltage Vreg (or current) supplied to at least a portion the operational memory 110 (e.g., memory cells 211 and the current monitor memory cells) accordingly; that is, the voltage level of Vreg may be increased when the measured cell leakage current is less than the prescribed maximum cell leakage current, and the voltage level of Vreg may be decreased when the measured cell leakage current is greater than the prescribed maximum cell leakage current. In this manner, the memory circuit 100 can be advantageously optimized so that it operates at a maximum speed as possible without exceeding a maximum permissible cell leakage current.

Although embodiments of a memory monitor circuit 130 are described herein which are operative to measure delay and/or leakage current in the operational memory, alternative embodiments of the memory monitor circuit are contemplated in which other characteristics of the operational memory are measured. For example, the row circuit of the operational memory often comprises a large plurality of row driver circuits including relatively large transistors which are a source of substantial leakage current. In accordance with an alternative embodiment of the memory monitor circuit 130, leakage current through the row driver circuits is measured and the voltage supplied to at least a portion of the operational memory is controlled as a function thereof. Furthermore, it is contemplated that techniques of the invention may be performed once, such as, for example, during an initial power-up of the memory circuit, or they may be performed periodically (e.g., continuously or at predetermined time intervals) so as to dynamically control voltage supplied to the operational memory.

Figure 6:
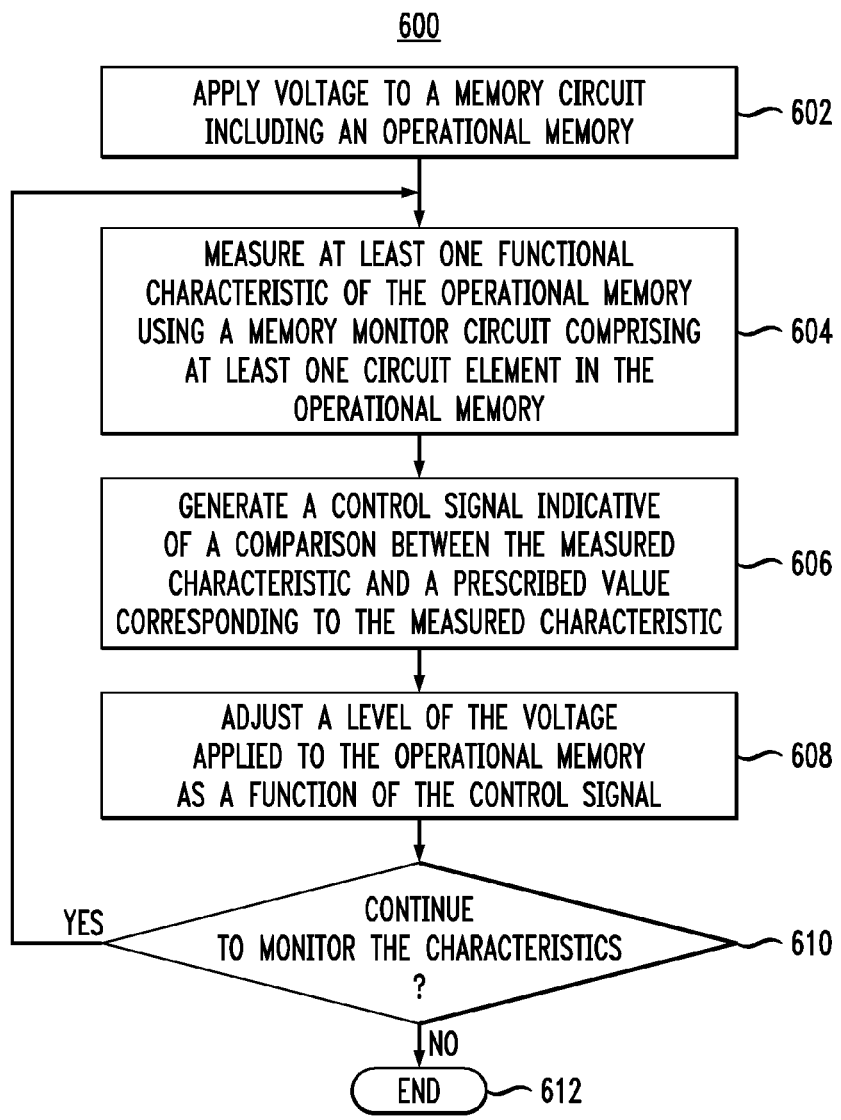
FIG. 6 is a flow diagram depicting an exemplary method for operating a memory circuit so as to advantageously reduce the overall power consumption in the memory circuit based on built-in self-characterization, according to an embodiment of the invention.

FIG. 6 is a flow diagram depicting an exemplary method 600 for operating a memory circuit so as to advantageously reduce overall power consumption in the memory circuit based on built-in self-characterization, in accordance with an embodiment of the invention. In step 602, voltage is applied to a memory circuit including an operational memory therein. As stated above, an operational memory is intended to broadly encompass circuitry comprising a plurality of memory cells, preferably organized into a memory array, and other circuitry necessary for operating the memory array. By way of example only and without limitation, illustrative embodiments of an operational memory are shown in FIGS. 2 and 3.

In step 604, at least one functional characteristic of the operational memory is measured using a monitor circuit comprising at least one circuit element in the operational memory. An illustrative embodiment of a memory monitor circuit was described herein above with reference to FIG. 3. Functional characteristics of the operational memory to be measured include, for example, delay through one or more signal paths and/or other circuit elements (e.g., row circuit, memory cells, row lines, sense amplifiers, row decoders, row drivers, etc.) in the operational memory and/or leakage current in the operational memory. Temperature may also be measured, for example, by generating a signal that is proportional to absolute temperature (PTAT) corresponding to at least one circuit element in the operational memory. PTAT generation circuits are well-known by those skilled in the art (see, e.g., U.S. Pat. No. 5,334,929 entitled "Circuit for Providing a Current Proportional to Absolute Temperature," the disclosure of which is incorporated by reference herein).

In step 606, a control signal is generated which is indicative of a comparison between the at least one measured characteristic and a prescribed value corresponding to the measured characteristic. For instance, in one embodiment of the invention, the prescribed value may be indicative of maximum delay in one or more signal paths in the operational memory. According to another embodiment, the prescribed value to be compared against the measured characteristic may be indicative of maximum leakage current in the operational memory. In either case, the control signal is used to adjust a level of voltage and/or current supplied to at least the operational memory in step 608.

The method 600 may be performed once, such as, for example, during a power-on initialization procedure in the memory circuit. Alternatively, method 600 may be performed multiple times during normal operation of the memory circuit, such as, for example, continuously or a prescribed time intervals (e.g., every minute), in accordance with embodiments of the invention. Accordingly, step 610 optionally determines whether or not to continue monitoring the at least one characteristic of the operational memory. If, after performing steps 604 through 608, it is determined that no further monitoring is desired, method 600 ends in step 612. Alternatively, as in the case of dynamic control of the voltage and/or current supplied to the operational memory, when monitoring of the at least one characteristic of the operational memory is to continue, method 600 proceeds back to step 604.

At least a portion of the techniques of the present invention may be implemented in one or more ICs. In forming ICs, die are typically fabricated in a repeated pattern on a surface of a semiconductor wafer. Individual die are cut or diced from the wafer, then packaged as ICs. In packaging the dies, individual die are attached to a receiving substrate according to methods of the invention. One skilled in the art would know how to dice wafers to produce integrated circuits. ICs so manufactured are considered part of this invention.

Figure 7:
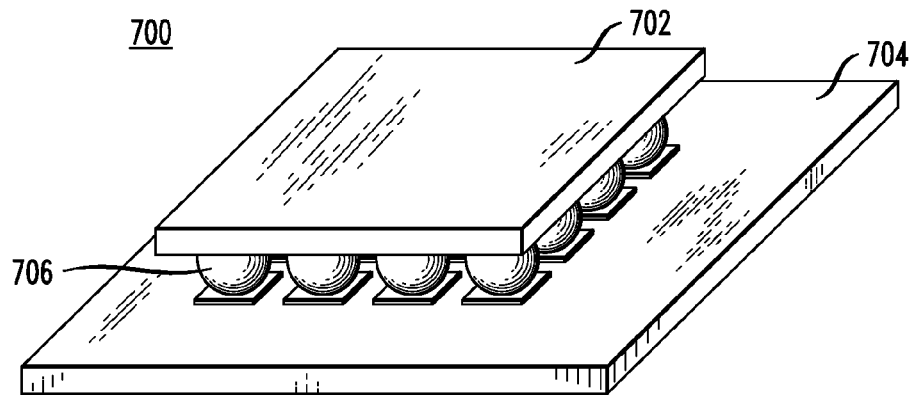
FIG. 7 is a perspective view depicting at least a portion of a semiconductor structure, according to an embodiment of the present invention.

FIG. 7 is a perspective view depicting at least a portion of a semiconductor structure 700, formed according to an embodiment of the invention for implementing techniques of the present invention. The semiconductor structure 700 comprises a first IC die 702 and at least a second IC die 704 mechanically mounted proximate to and electrically interconnected with the first IC die, for example in a known manner. An illustrative embodiment of this application includes, but is not limited to, flip-chip and multi-chip module (MCM) technology.

The means of electrical interconnection contemplated by the invention is not limited and may include, for example, utilizing solder bumps, wire bonding, etc. As shown, the interconnection means used in semiconductor structure 700 includes a plurality of solder bumps 706, or alternative conductive structures, each solder bump being formed between a bonding site on the first IC die 702 and a corresponding bonding site on the second IC die 704. One or more of the first and second IC die 702 and 704, respectively, includes a memory circuit formed in accordance with techniques of the invention described herein. Semiconductor structures so manufactured are also considered part of this invention.

An IC formed in accordance with interconnection techniques of the present invention can be employed in essentially any application and/or electronic system. Suitable systems for implementing the invention may include, but are not limited to, personal computers, communication networks, portable communications devices (e.g., cell phones), etc. Systems incorporating such ICs are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory circuit, comprising:
   an operational memory;
   a monitor circuit comprising at least one of a circuit element in the operational memory and a circuit element substantially identical to a corresponding circuit element in the operational memory, the monitor circuit being operative to measure at least one functional characteristic of the operational memory;
   a control circuit coupled to the monitor circuit and operative to generate a control signal which varies as a function of the at least one functional characteristic of the operational memory; and
   a programmable voltage source coupled to the operational memory and operative to generate at least one of a voltage and a current supplied to at least a portion of the operational memory which varies as a function of the control signal.

2. The memory circuit of claim 1, wherein the control circuit comprises a comparator operative to receive the at least one functional characteristic and to generate the control signal as a function of a comparison between the at least one functional characteristic of the operational memory and a prescribed value corresponding to the at least one functional characteristic.

3. The memory circuit of claim 1, wherein the operational memory comprises:
   a plurality of row lines;
   a row circuit coupled to the plurality of row lines;
   at least first and second column lines;
   a first column circuit connected to the at least first column line;
   a second column circuit connected to the at least second column line;
   a first plurality of memory cells, each of the first plurality of memory cells being connected to a corresponding unique pair of a given one of the row lines and the at least first column line; and
   a second plurality of memory cells, each of the first plurality of memory cells being connected to a corresponding unique pair of a given one of the row lines and the at least first column line;
   wherein the monitor circuit comprises the second plurality of memory cells, the at least second column line and the second column circuit.

4. The memory circuit of claim 3, wherein the monitor circuit is operative to measure a delay of a signal path through the row circuit.

5. The memory circuit of claim 3, wherein each of the second plurality of memory cells is substantially identical to each of the first plurality of memory cells.

6. The memory circuit of claim 3, wherein a column in the monitor circuit which includes the second plurality of memory cells, the at least second column line and the second column circuit exhibits a loading which is substantially matched to a loading exhibited by a column in the operational memory which includes memory cells in the first plurality of memory cells coupled to the at least first column line, the at least first column line and the first column circuit.

7. The memory circuit of claim 1, wherein the operational memory, the monitor circuit, the control circuit and the programmable voltage source are connected together to form a closed-loop feedback control system.

8. The memory circuit of claim 1, wherein the monitor circuit comprises a first plurality of memory cells connected to a first column line, each of the first plurality of memory cells being substantially matched to each of a second plurality of memory cells connected to a given column line in the operational memory.

9. The memory circuit of claim 8, wherein each of the first and second plurality of memory cells comprises at least one of a static random access memory cell, a read only memory cell, a flash memory cell, a one-time programmable memory cell, a few-times programmable memory cell, a phase change memory cell, a volatile memory cell and a non-volatile memory cell.

10. The memory circuit of claim 1, wherein the operational memory comprises a leakage current path, and wherein the monitor circuit is operative to measure a leakage current through the leakage current path.

11. The memory circuit of claim 1, wherein the operational memory comprises a signal delay element, and wherein the monitor circuit is operative to measure a time delay through the signal delay element.

12. The memory circuit of claim 1, wherein the monitor circuit is operative to continuously measure the at least characteristic of the operational memory.

13. The memory circuit of claim 1, wherein the monitor circuit is operative to measure the at least characteristic of the operational memory at one or more prescribed time intervals.

14. A method of operating a memory circuit, including an operational memory, to reduce overall power consumption in the memory circuit, the method comprising the steps of:
    measuring at least one functional characteristic of the operational memory using a monitor circuit, the monitor circuit comprising at least one of a circuit element in the operational memory and a circuit element substantially identical to a corresponding circuit element in the operational memory;
    generating a control signal which varies as a function of the at least one functional characteristic of the operational memory; and
    controlling a level of at least one of a voltage and a current supplied to at least a portion of the operational memory as a function of the control signal.

15. The method of claim 14, wherein the step of generating the control signal comprises comparing the measured at least one functional characteristic of the operational memory with a prescribed value corresponding to the at least one functional characteristic, the control signal being indicative of a comparison between the at least one functional characteristic of the operational memory and the prescribed value.

16. The method of claim 14, wherein the step of measuring the at least one functional characteristic comprises measuring a time delay through at least one signal delay element in the operational memory, and wherein the step of controlling the level of at least one of the voltage and the current supplied to at least a portion of the operational memory comprises increasing a voltage supplied to at least a portion of the operational memory when the measured time delay is less than a prescribed delay, and decreasing the voltage supplied to at least a portion of the operational memory when the measured time delay is greater than the prescribed delay.

17. The method of claim 14, wherein the step of measuring the at least one functional characteristic comprises measuring leakage current through at least one leakage current path in the operational memory, and wherein the step of controlling the level of at least one of the voltage and the current supplied to at least a portion of the operational memory comprises increasing the voltage supplied to at least a portion of the operational memory when the measured leakage current is less than a prescribed maximum leakage current, and decreasing the voltage supplied to at least a portion of the operational memory when the measured cell leakage current is greater than the prescribed maximum leakage current.

18. An integrated circuit including at least one memory circuit, the at least one memory circuit comprising:
    an operational memory;
    a monitor circuit comprising at least one of a circuit element in the operational memory and a circuit element substantially identical to a corresponding circuit element in the operational memory, the monitor circuit being operative to measure at least one functional characteristic of the operational memory;
    a control circuit coupled to the monitor circuit and operative to generate a control signal which varies as a function of the at least one functional characteristic of the operational memory; and
    a programmable voltage source coupled to the operational memory and operative to generate at least one of a voltage and a current supplied to at least a portion of the operational memory which varies as a function of the control signal.

19. An electronic system, comprising:
    at least one integrated circuit including at least one embedded memory circuit, the at least one embedded memory circuit comprising:
        an operational memory;
        a monitor circuit comprising at least one of a circuit element in the operational memory and a circuit element substantially identical to a corresponding circuit element in the operational memory, the monitor circuit being operative to measure at least one functional characteristic of the operational memory;
        a control circuit coupled to the monitor circuit and operative to generate a control signal which varies as a function of the at least one functional characteristic of the operational memory; and
        a programmable voltage source coupled to the operational memory and operative to generate at least one of a voltage and a current supplied to at least a portion of the operational memory which varies as a function of the control signal.

20. A semiconductor structure, comprising:
    a first integrated circuit die; and
    at least a second integrated circuit die mechanically mounted proximate to and electrically interconnected with the first integrated circuit die, at least one of the first and at least second integrated circuit die including a memory circuit comprising:
        an operational memory;
        a monitor circuit comprising at least one of a circuit element in the operational memory and a circuit element substantially identical to a corresponding circuit element in the operational memory, the monitor circuit being operative to measure at least one functional characteristic of the operational memory;
        a control circuit coupled to the monitor circuit and operative to generate a control signal which varies as a function of the at least one functional characteristic of the operational memory; and
        a programmable voltage source coupled to the operational memory and operative to generate at least one of a voltage and a current supplied to at least a portion of the operational memory which varies as a function of the control signal.

21. The method of claim 14, wherein the step of measuring the at least one functional characteristic comprises measuring a time delay through at least one signal delay element in the operational memory, and wherein the step of controlling the level of at least one of the voltage and the current supplied to at least a portion of the operational memory comprises increasing a voltage supplied to at least a portion of the operational memory when the measured time delay is greater than a prescribed delay, and decreasing the voltage supplied to at least a portion of the operational memory when the measured time delay is less than the prescribed delay.

22. The memory circuit of claim 1, wherein the monitor circuit comprises a first circuit element in the operational memory and a second circuit element external to the operational memory.

23. The memory circuit of claim 1, wherein the monitor circuit comprises a first circuit element in the operational memory and a second circuit element substantially identical to a corresponding circuit element in the operational memory.

24. The memory circuit of claim 1, wherein the monitor circuit comprises a circuit element substantially identical to a corresponding circuit element in the operational memory, wherein the substantially identical circuit element in the monitor unit is external to the operational memory, and wherein the corresponding circuit element in the operational memory is external to the monitor circuit.

25. The memory circuit of claim 1, wherein each of the operational memory and the monitor circuit comprises one or more memory cells.

26. The memory circuit of claim 25, wherein the monitor circuit comprises at least one of a memory cell in the operational memory and a memory cell substantially identical to a corresponding memory cell in the operational memory.

* * * * *